(12) United States Patent
Kwong et al.

(10) Patent No.: US 10,707,315 B2
(45) Date of Patent: *Jul. 7, 2020

(54) HYBRID DOPING PROFILE

(71) Applicant: Taiwan Semiconductor Manufacturing Co., Ltd., Hsinchu (TW)

(72) Inventors: Henry Kwong, Hong Kong (CN); Chih-Yung Lin, Hsinchu (TW); Po-Nien Chen, Miaoli (TW); Chen Hua Tsai, Hsinchu (TW)

(73) Assignee: Taiwan Semiconductor Manufacturing Co., Ltd. (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/390,515

(22) Filed: Apr. 22, 2019

(65) Prior Publication Data

US 2019/0245050 A1    Aug. 8, 2019

Related U.S. Application Data

(63) Continuation of application No. 15/141,951, filed on Apr. 29, 2016, now Pat. No. 10,312,334.

(51) Int. Cl.
| | |
|---|---|
| *H01L 29/10* | (2006.01) |
| *H01L 29/417* | (2006.01) |
| *H01L 29/78* | (2006.01) |
| *H01L 29/66* | (2006.01) |
| *H01L 29/08* | (2006.01) |
| *H01L 21/265* | (2006.01) |

(52) U.S. Cl.
CPC .... *H01L 29/41791* (2013.01); *H01L 29/0847* (2013.01); *H01L 29/1041* (2013.01); *H01L 29/66795* (2013.01); *H01L 29/785* (2013.01); *H01L 21/26513* (2013.01); *H01L 21/26586* (2013.01)

(58) Field of Classification Search
CPC ..... H01L 29/1041–1054; H01L 21/265; H01L 21/823807
See application file for complete search history.

(56) References Cited

U.S. PATENT DOCUMENTS

| | | |
|---|---|---|
| 6,174,778 B1 | 1/2001 | Chen et al. |
| 6,410,410 B1 | 6/2002 | Feudel et al. |
| 6,521,502 B1 | 2/2003 | Yu |
| 10,312,334 B2 * | 6/2019 | Kwong ............... H01L 29/785 |
| 2004/0110351 A1 | 6/2004 | Narasimha |

(Continued)

*Primary Examiner* — Eric A. Ward
*Assistant Examiner* — Eric K Ashbahian
(74) *Attorney, Agent, or Firm* — Sterne, Kessler, Goldstein & Fox P.L.L.C.

(57) ABSTRACT

A semiconductor device having a hybrid doping distribution and a method of fabricating the semiconductor device are presented. The semiconductor device includes a gate disposed over an active semiconducting region and a first S/D region and a second S/D region each aligned to opposing sides of the gate side walls. The active semiconducting region has a doping profile that includes a first doping region at a first depth beneath the gate and having a first dopant concentration. The doping profile includes a second doping region at a second depth beneath the gate greater than the first depth and having a second dopant concentration less than the first dopant concentration.

20 Claims, 8 Drawing Sheets

(56) References Cited

U.S. PATENT DOCUMENTS

| | | | |
|---|---|---|---|
| 2004/0256683 A1* | 12/2004 | Lee | H01L 21/823412 257/412 |
| 2005/0001297 A1 | 1/2005 | Kotani | |
| 2006/0027865 A1* | 2/2006 | Handa | H01L 29/0847 257/336 |
| 2008/0029830 A1* | 2/2008 | Tsai | H01L 21/823807 257/408 |
| 2008/0265321 A1 | 10/2008 | Yu et al. | |
| 2011/0193141 A1* | 8/2011 | Lin | H01L 29/045 257/255 |
| 2012/0049295 A1 | 3/2012 | Wang et al. | |
| 2013/0026569 A1* | 1/2013 | Hao | H01L 21/2253 257/344 |
| 2013/0200455 A1 | 8/2013 | Lo et al. | |
| 2013/0320449 A1 | 12/2013 | Hoentschel et al. | |
| 2014/0021545 A1 | 1/2014 | Nandakumar et al. | |
| 2015/0084108 A1* | 3/2015 | Saha | H01L 21/823807 257/314 |
| 2016/0284549 A1* | 9/2016 | Nguyen | H01L 21/26506 |

* cited by examiner

HYBRID DOPING PROFILE

CROSS-REFERENCE TO RELATED APPLICATIONS

This application claims priority to U.S. patent application Ser. No. 15/141,951, titled "Hybrid Doping Profile," filed Apr. 29, 2016, the disclosure of which is incorporated by reference herein in its entirety.

BACKGROUND

Doping of semiconductor materials using n-type or p-type dopants is an important step during the manufacturing of transistors. Doping procedures are carefully controlled to produce a desired dopant concentration profile in the semiconducting material. If the doping results in a concentration that is too high, an increase in the leakage current and short channel effect (SCE) may occur. However, if the doping results in a concentration that is too low, the threshold voltage of the transistor may increase beyond an acceptable level.

As technology advances, transistors become smaller and the gate length approach lengths on the order of less than 16 nm. It becomes increasingly difficult to provide adequate doping profiles for such small devices, especially for those transistors that are driven at higher voltages. These high voltage transistors are also commonly known as I/O devices or power transistors since they handle higher voltages than core logic-based transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
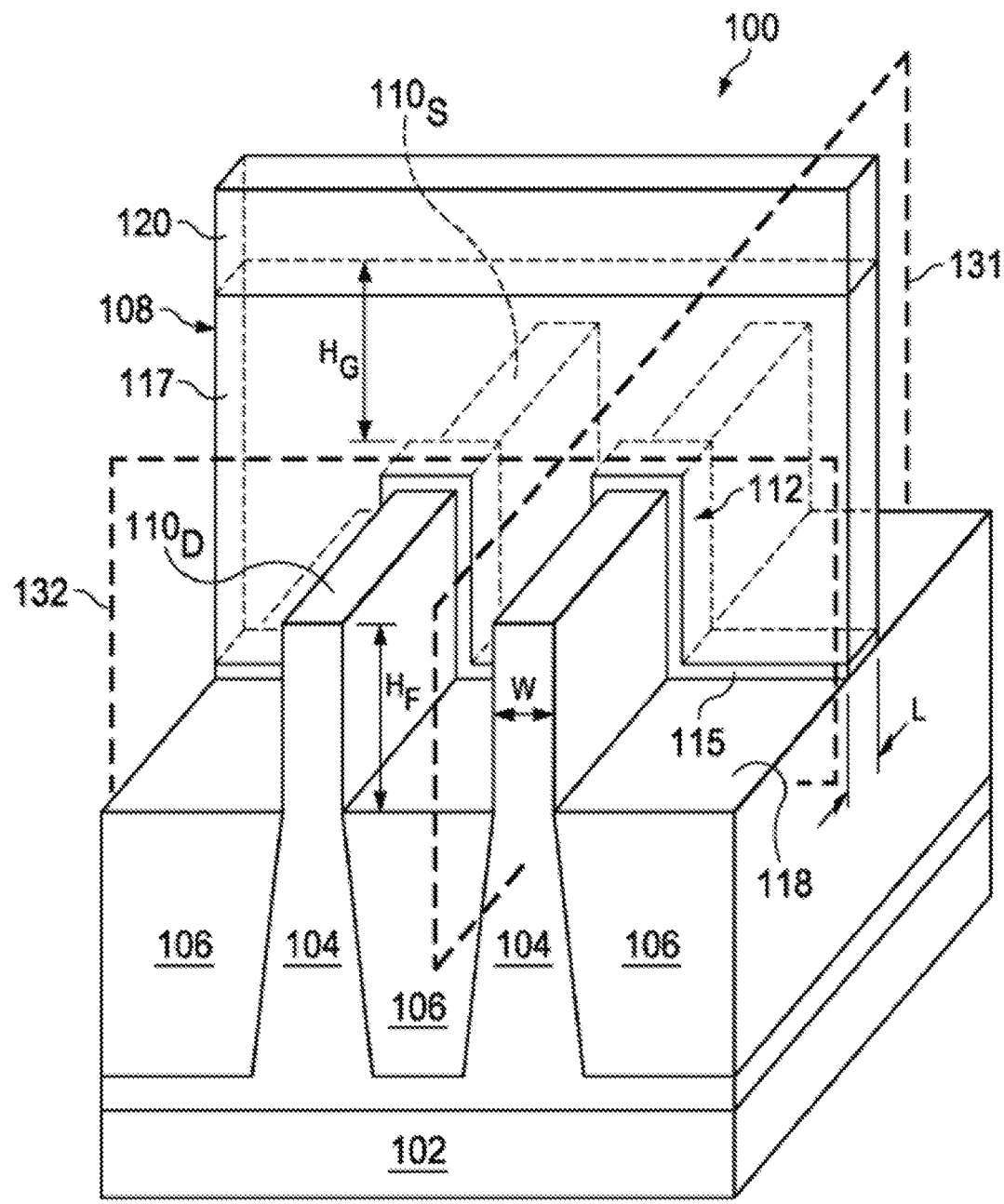
FIG. 1A is a perspective view of an example semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. A very common type of FET is referred to as a metal oxide semiconductor field effect transistor (MOSFET). Historically, MOSFETs have been planar structures built in and on the planar surface of a substrate such as a semiconductor wafer. But recent advances in semiconductor manufacturing have resulted in the implementation of FETs as vertical structures.

The term "finFET" refers to a FET that is at least partially formed over a fin that is vertically oriented with respect to the planar surface of a wafer.

S/D refers to the source and/or drain junctions that form two of the four terminals of a FET.

The expression "epitaxial layer" herein refers to a layer or structure of single crystal material, and typically is referring to a single-crystalline semiconductor material. Likewise, the expression "epitaxially grown" herein refers to a layer or structure of single crystal material. The shortened term "epi" may be used herein to stand for "epitaxial."

The expression "high-k" refers to a high dielectric constant. As used herein, high-k refers to a dielectric constant that is greater than the dielectric constant of $SiO_2$ (i.e., greater than 3.9).

The term "vertical," as used herein, means nominally perpendicular to the surface of a substrate.

Overview

Various embodiments in accordance with this disclosure provide a hybrid doping profile for a semiconductor device that includes two different doping steps to produce a doping profile that optimizes leakage current, hot carrier injection life-time (HCI LT), and the short channel effect (SCE). HCI LT represents the useful life-time of the semiconductor device due to the effect of highly energized carriers that can tunnel through the gate oxide. SCE represents an effect where the effective channel length beneath the gate of the semiconductor device becomes shorter than the actual channel length, thus leading to some potentially detrimental outcomes.

Before describing the embodiments related to the hybrid doping profile, an example fabrication process for a finFET, which includes a doping step to dope the fin before the formation of the S/D regions, is presented. FIGS. 1-3 provide various views of a semiconductor device that includes finFETs during various stages of fabrication. The fabrication process provided here is exemplary, and many other steps may be performed that are not shown in these figures.

Illustrated in FIG. 1A is perspective view of a semiconductor device structure 100, in accordance with some embodiments. The semiconductor device structure 100 includes finFET device structures. Semiconductor device structure 100 includes a substrate 102, a plurality of fins 104, a plurality of isolation structures 106, and a gate structure 108 disposed over the sidewalls and top surface of each of fins 104. gate structure 108 includes a gate dielectric layer 115, a gate electrode layer 117, and/or one or more additional layers. A hard mask layer 120 is over gate electrode layer 117. Hard mask layer 120 is used to pattern, such as by etching, gate structure 108. In some embodiments, hard mask layer 120 is made of a dielectric material, such as silicon oxide. The perspective view of FIG. 1A is taken after the patterning (or forming) process of gate structure 108. FIG. 1A shows only one gate structure 108. There are additional gate structure(s) (not shown) similar and parallel to gate structure 108 shown in FIG. 1A. Those skilled in the art will understand that typical integrated circuits contain a plurality of such, and similar, gate structures.

Each of the plurality of fins 104 includes a source region $110_S$ and a drain region $110_D$, where source or drain features are formed in, on, and/or surrounding fin 104. A channel region 112 of fin 104 underlies gate structure 108. Channel region 112 of fin 104 has a length (gate length) L, and a width (gate width) W, as shown in FIG. 1A. In some embodiments, the length (gate length) L is in a range from about 10 nm to about 30 nm. In other embodiments, the gate length L is in a range from about 3 nm to about 10 nm. In some embodiments, the fin width W is in a range from about 10 nm to about 20 nm. In other embodiments, the fin width W is in a range from about 3 nm to about 10 nm. The height (gate height) $H_G$ of gate structure 108, measured from the top of fin 104 to the top of gate structure 108, is in a range from about 50 nm to about 80 nm, in some embodiments. The height (fin height) $H_F$ of fin 104, measured from the surface of isolation structure 106 to the top of fin 104, is in a range from about 35 nm to about 60 nm, in some embodiments.

Substrate 102 may be a silicon substrate. Alternatively, substrate 102 may comprise another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an alternative embodiment, the substrate 102 is a semiconductor on insulator (SOI). When an SOI substrate is used, the fin structure may protrude from the silicon layer of the SOI substrate or may protrude from the insulator layer of the SOI substrate. In the latter case, the silicon layer of the SOI substrate is used to form fin 104. Substrate 102 may include various regions that have been suitably doped with impurities (e.g., p-type or n-type).

Isolation structures 106 are made of a dielectric material and may be formed of silicon oxide, silicon nitride, silicon oxynitride, fluoride-doped silicate glass (FSG), a low-k dielectric material, and/or other suitable insulating material. Isolation structures 106 may be shallow trench isolation (STI) features. In an embodiment, the isolation structures are STI features and are formed by etching trenches in substrate 102. The trenches may then be filled with isolating material, followed by a chemical mechanical polish (CMP). Other fabrication techniques for forming isolation structures 106 and/or fin structure 104 are possible. Isolation structures 106 may include a multi-layer structure, for example, having one or more liner layers.

Fin structures 104 are active regions where one or more transistors are formed. In an embodiment, a channel region 112 of a transistor device is formed in fin 104. Fin 104 may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms a recesses into isolation structures 106, leaving protruding fins. The recesses may be etched using reactive ion etch (RIE) and/or other suitable processes. Numerous other embodiments of methods to form fins 104 on substrate 102 may be suitable.

Gate structure 108 may include a gate dielectric layer 115, a gate electrode layer 117, and/or one or more additional layers. In an embodiment, gate structure 108 is a sacrificial gate structure such as formed in a replacement gate process used to form a metal gate structure. In an embodiment, gate structure 108 includes a polysilicon layer (as gate electrode layer 117). In some embodiments, gate dielectric layer 115 may include one or more layers of silicon oxide, silicon nitride, silicon oxy-nitride, or high-k dielectrics. In some embodiments, a thickness of the gate dielectric layer 115 is in a range of about 5 nm to about 20 nm, and in a range of about 5 nm to about 10 nm in other embodiments.

In an embodiment, gate structure 108 is a metal gate structure. The metal gate structure may include interfacial layer(s), gate dielectric layer(s), work function layer(s), fill metal layer(s) and/or other suitable materials for a metal gate structure. In other embodiments, metal gate structure 108 may further include capping layers, etch stop layers, and/or other suitable materials. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), chemical vapor deposition (CVD), and/or other suitable formation process.

Exemplary p-type work function metals that may be included in gate structure 108 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in gate structure 108 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, physical vapor deposition (PVD), and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the sacrificial gate structure.

Semiconductor device structure 100 described above includes fins 104 and gate structure 108. Semiconductor device structure 100 needs additional processing to form various features, such as lightly-doped-drain (LDD) regions and doped source/drain structures, of the transistor utilizing structure 100. LDD regions are next to channel regions and are under spacers. The term LDD regions is used to describe lightly doped regions next to both source and drain regions. According to an embodiment, a hybrid doping procedure may be performed to dope the LDD regions of fins 104. The hybrid doping procedure is described in more detail with reference to FIG. 5.

Figure 1B:
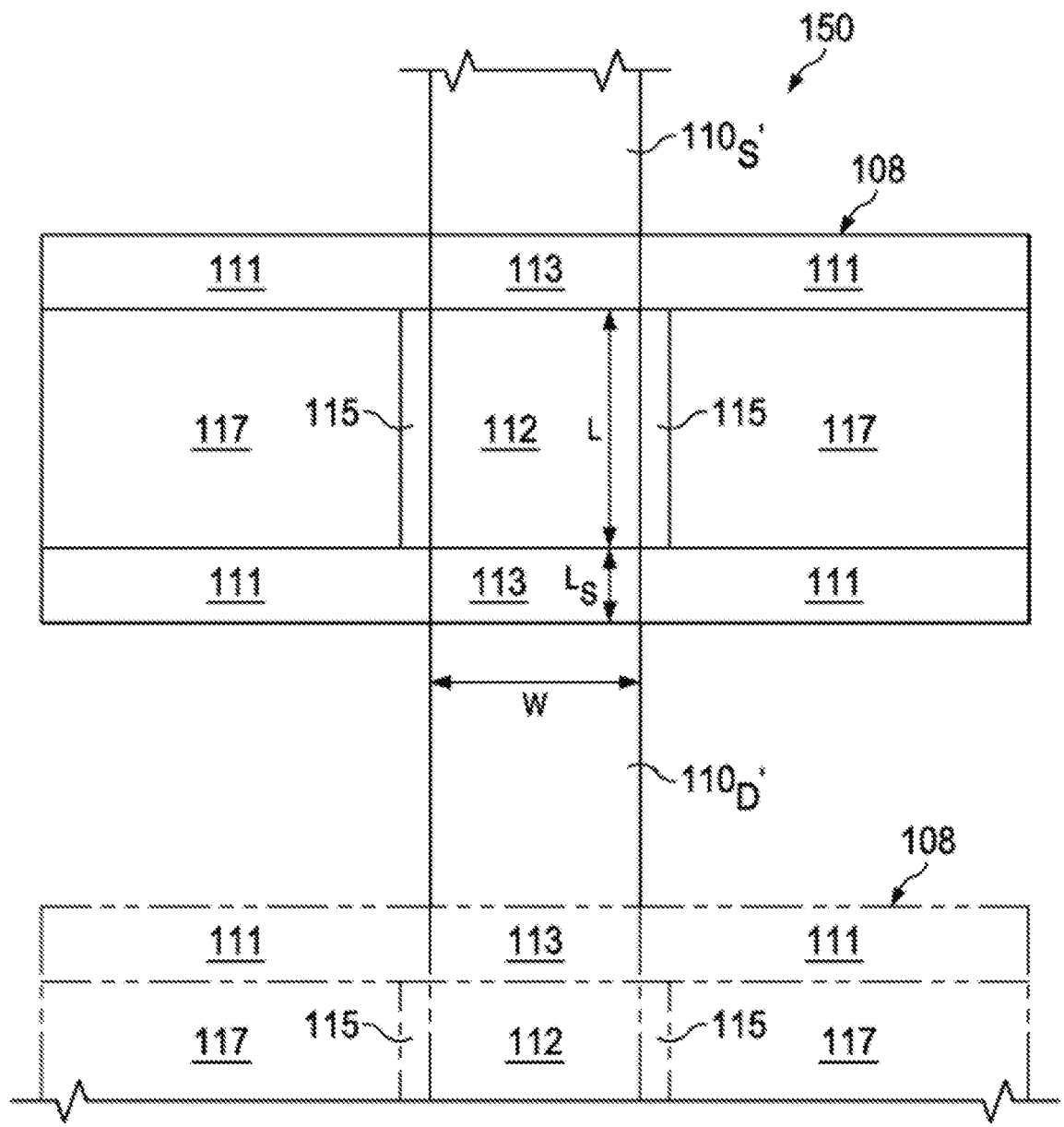
FIG. 1B shows a top view of an example transistor region, in accordance with some embodiments.

FIG. 1B is a top view of a transistor region 150 formed with one of fins 104 of FIG. 1A and taken on a surface leveled with the top surface 118 of isolation structure 106, in accordance with some embodiments. Transistor region 150 includes a doped source region $110_S'$ and a doped drain region $110_D'$, which have the same cross-sections as doped source regions $110_S$ and doped drain region $110_D$, respectively, of FIG. 1A at surface 118.

Transistor region 150 also includes a channel region 112, which is part of fin 104 and is surrounded by gate structure 108 on three sides, as shown in FIG. 1A. Channel region 112 has a length (gate length) L and a width (gate width) W. Transistor region 150 also includes gate dielectric layer 115 and gate electrode layer 117. FIG. 1B shows LDD regions 113 between source region $110_S$ and channel region 112, and between drain region $110_D$ and channel region 112. LDD regions 113 have a width W and a length $L_S$, which is defined by the width of spacers 111. FIG. 1B shows another gate structure 108 by dotted lines. This other gate structure 108 has been described above as being similar and parallel to gate structure 108 and is not shown in FIG. 1A. In some embodiments, $L_S$ is in a range from about 5 nm to about 10 nm.

Figure 2A:
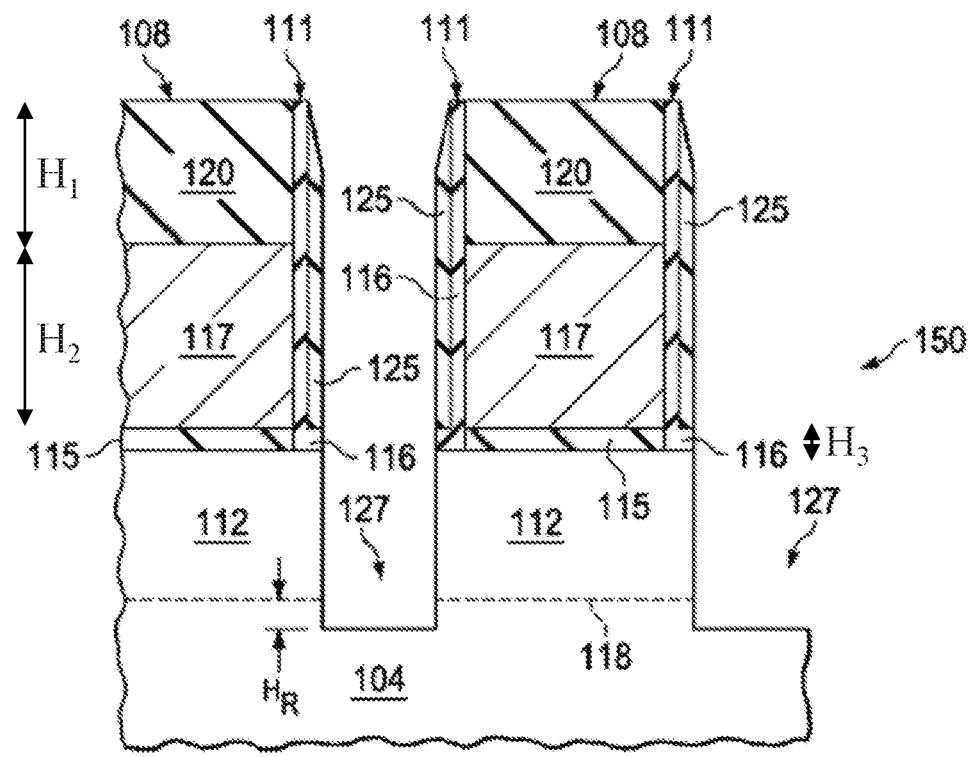
FIGS. 2A and 2B are cross-sectional views of an example transistor region, in accordance with some embodiments.
Figure 2B:
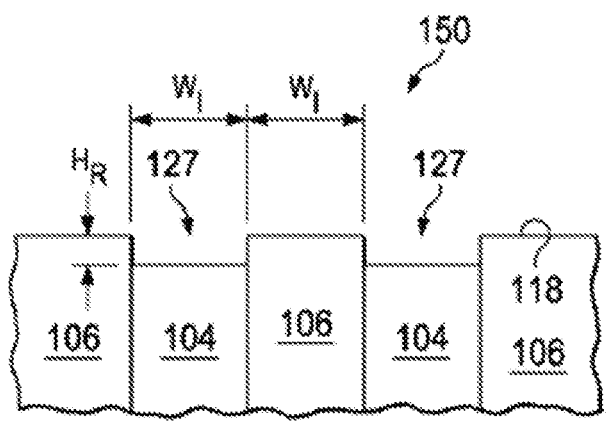

FIGS. 2A and 2B are cross-sectional views of transistor region 150 after recesses 127 are formed, in accordance with some embodiments. Prior to recessing the source and drain regions of p-channel devices, a photolithography process could be used to cover other regions, such as n-channel device regions, on substrate 102, with photoresist to prevent etching. As a result, a resist removal process is needed after the etching process and before the next operation. An additional cleaning process could be used to ensure no residual resist remains on the substrate.

FIG. 2A shows two neighboring gate structures 108 according to the cut 131 illustrated in FIG. 1A, in accordance with some embodiments. As mentioned above, there are additional gate structure(s) similar and parallel to gate structure 108 shown in FIG. 1A. FIG. 2A shows two neighboring gate structures 108 formed over fin 104 and separated by recesses 127, which are formed by etching source/drain regions $110_D$ and $110_S$ of FIG. 1A. For simplicity of discussion, we designate recesses 127 as recessed drain region ($110_D$). Each gate structure 108 includes a gate electrode layer 117 and a gate dielectric layer 115. A hard mask layer 120 is formed over the gate electrode layer 117, in accordance with some embodiments. Hard mask layer 120 is used in assisting patterning of gate structures 108. In some embodiments, the thickness $H_1$ of hard mask layer 120 is in a range from about 70 nm to about 100 nm. The thickness $H_2$ of gate electrode layer 117 is in a range from about 80 nm to about 100 nm. The thickness $H_3$ of gate dielectric layer 115 is in a range from about 2 nm to about 5 nm. The channel length L is shown in FIG. 2A as equal to the width of gate electrode layer 117 of gate structure 108. Channel regions 112, which are directly under gate structures 108 are also noted in FIG. 2A. A dotted line 118 indicates the level of surfaces of isolation regions 106.

FIG. 2A also show spacers 111 formed next to gate structures 108. Spacers 111 include an offset spacer layer 116 and a main spacer layer 125, in accordance with some embodiments. Between neighboring gate structures 108, there are recesses 127. The depth $H_R$ of recesses 127 below surface 118 of isolation structures 106 is in a range from about 10 nm to about 20 nm. Recesses 127 may be formed to have either an angular or rounded shape on the bottoms.

FIG. 2B shows a cross-sectional view of transistor region 150 according to the cut 132 illustrated in FIG. 1A, in accordance with some embodiments. FIG. 2B shows recesses 127 in two neighboring recessed fins 104 separated (or isolated) from each other by an isolation structure 106. Each of the two neighboring recessed fins 104 has isolation structures 106 on both sides. The distance $W_1$ between the two neighboring recesses 127 is in a range from about 10 nm to about 20 nm, in some embodiments.

After the recesses 127 are formed, an epitaxial layer is grown in recesses 127 to form doped source and drain regions, $110_D'$ and $110_S'$ respectively, at operation 206 of FIG. 2, in accordance with some embodiments. Doped source and drain regions $110_D'$ and $110_S'$ are located right next to the LDD regions 113, which are between channel regions 112 and source/drain regions $110_D'$, $110_S'$. The dopants in the doped source and drain regions, $110_D'$, $110_S'$, could diffuse into and dope the LDD regions 113 by annealing. In order to dope the LDD regions 113, the dopant concentration of the doped source and drain regions $110_D'$ and $110_S'$ needs to be much higher than the required dopant concentration of the LDD regions 113. For example, if the dopant level (or concentration) of p-type dopant in the LDD regions 133 is at a value equal to or greater than about 1E20 atoms/cm$^3$, the dopant concentration of the doped source and drain regions should have a value equal to or greater than about 3E20 atoms/cm$^3$.

In some embodiments, the epitaxial material filling recesses 127 to form doped source and drain regions, $110_D'$ and $110_S'$, is a silicon-containing material 215. In some embodiments, the epitaxially-grown silicon-containing material 215 is formed by an epitaxial deposition/partial etch process, which repeats the epitaxial deposition/partial etch process at least once. Such repeated deposition/partial etch process is also called a cyclic deposition-etch (CDE) process.

The deposition of silicon-containing material 215 includes in-situ doping the silicon-containing material 215, in accordance with some embodiments. For example, forming an n-channel transistor can use an n-type doping precursor, e.g., phosphine (PH$_3$) and/or other n-type doping precursor. By using the in-situ doping process, the dopant concentration (or level) of silicon-containing material 215 can be desirably controlled and achieved. In some embodiments, silicon-containing material 215 can be an n-type doped silicon layer that is doped with phosphorus (Si:P). In some embodiments, silicon-containing material 215 can be an n-type doped silicon layer that is doped with both phosphorus and carbon (Si:CP). Carbon could impede the out-diffusion of phosphorus from silicon-containing material 215. In some embodiments, the carbon dopant has a concentration in a range from about 0.1% to about 5% (atomic percent). Other types of dopants may also be included, including various doping precursors and dopants for forming a p-channel transistor, such as boron-doped silicon germanium (SiGeB), as would be known to a person skilled in the art.

In some embodiments, the silicon-containing material 215 can be formed by CVD, e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof.

The silicon-containing material 215 in recesses 127 is epitaxial. The deposition process forms a thin epitaxial layer of silicon-containing material in recesses 127 and an amorphous silicon-containing material on non-crystalline surfaces. An etching (or partial etching) process removes the amorphous silicon-containing material and also a portion of the silicon-containing material in recesses 127. The remaining silicon-containing material 215 is formed in each of recesses 127.

In some embodiments, the etching process can use an etching gas including at least one of hydrogen chloride (HCl), chlorine ($Cl_2$), other suitable etching gases, and/or any combinations thereof. The etching process would remove the amorphous silicon-containing material over non-crystalline surface at a rate higher than the removal rate of epitaxial silicon-containing material 215. Therefore, only epitaxial film remains on the substrate surface after a CDE cycle. The epitaxial deposition/partial etch process is repeated a number of times until a desired thickness is reached. As a result, such repeated deposition/partial etch process is called a cyclic deposition-etch process.

Figure 3A:
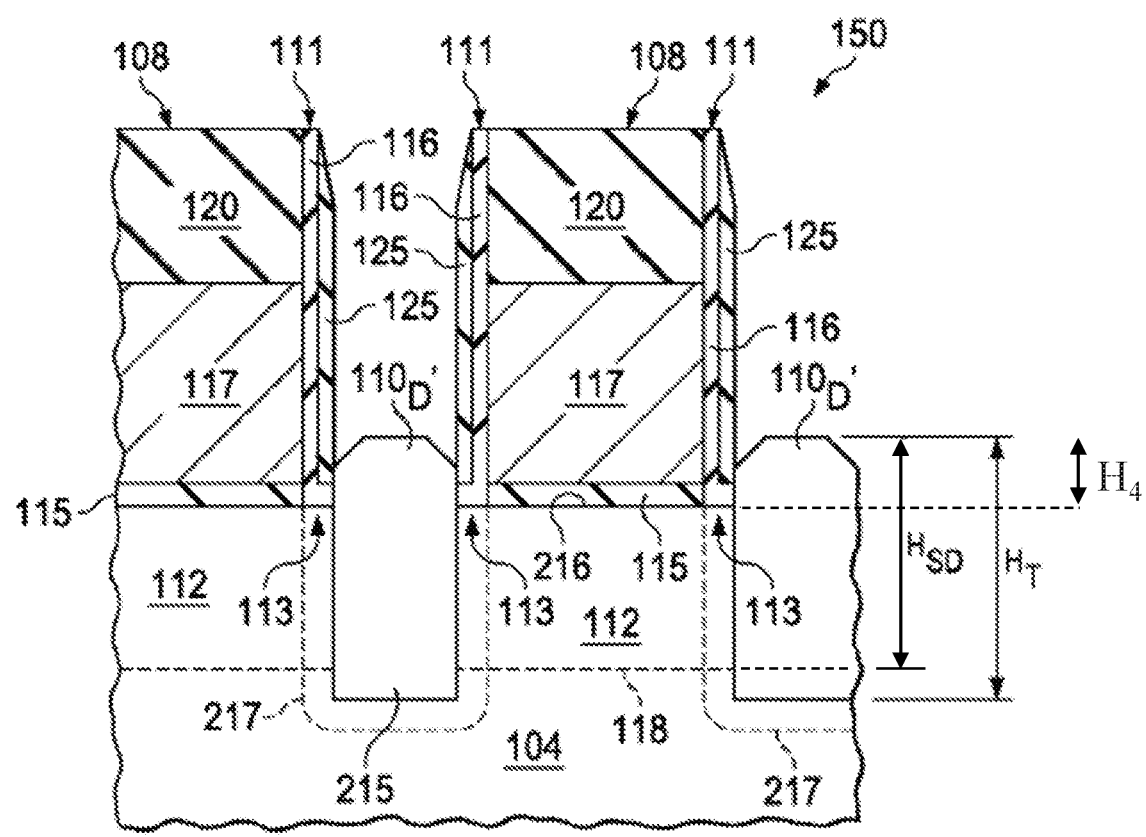
FIGS. 3A and 3B are cross-sectional views of an example transistor region after forming the doped source and drain regions, in accordance with some embodiments.
Figure 3B:
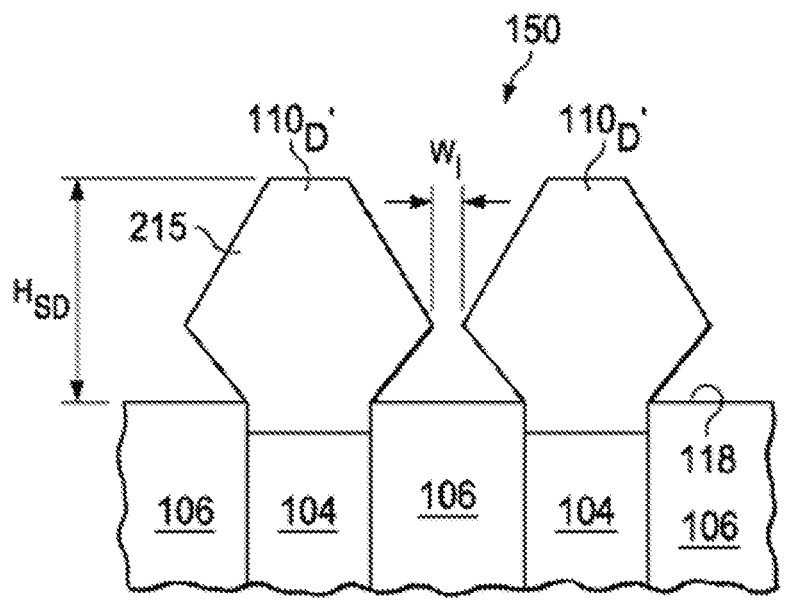

FIGS. 3A and 3B show cross-sectional views of doped drain regions $110_D'$ formed by the CDE process described above, in accordance with some embodiments. The growth rate of epitaxial Si depends on the crystal orientation. Growth rate is slower on closed-packed {111} planes. The doped drain regions $110_D'$ are made of doped silicon-containing material 215, which also form doped source regions $110_S'$ (not shown in FIGS. 3A and 3B). In some embodiments, the total thickness $H_T$ of epitaxial silicon-containing material 215 is in a range from about 40 nm to about 50 nm. The height (or thickness) $H_4$ of doped drain regions $110_D'$ above surface 216 between channel regions 112 and gate dielectric layer 115 is in a range from about 2 nm to about 10 nm, in some embodiments. The height (or thickness) $H_{SD}$ of doped drain regions $110_D'$ above surface 118 is in a range from about 35 nm to about 45 nm, in some embodiments. The shortest distance $W_1$ between two neighboring doped drain regions $110_D'$ is in a range from about 5 nm to about 20 nm, in accordance with some embodiments. Doped source regions $110_S'$ resemble the doped drain regions $110_D'$. The description above for doped drain regions $110_D'$ also applies for doped source regions $110_S'$.

Figure 4:
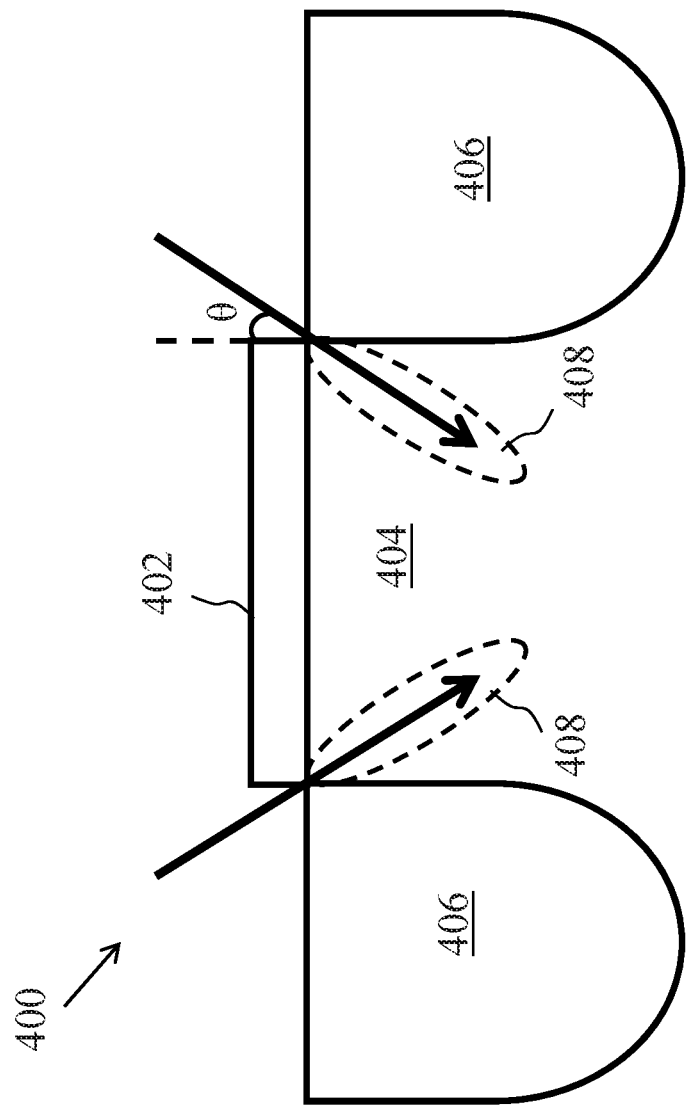
FIG. 4 is a cross-section illustration of a doping profile.

FIG. 4 illustrates a typical doping profile for a semiconductor device 400. In FIG. 4, semiconductor device 400 is a transistor. Semiconductor device 400 includes a gate 402 overlaying a semiconducting region 404, and S/D regions 406 on either side of semiconducting region 404. Semiconductor device 400 may represent a high voltage I/O finFET. It should be understood that many elements are omitted from FIG. 4 for clarity, including sidewall spacers on gate 402, and a gate dielectric disposed between gate 402 and semiconducting region 404.

A LDD doping process results in dopants being diffused, implanted, or driven into semiconducting region 404. The dopants may include boron, boron difluoride, or indium for a p-channel device and phosphorous or arsenic for an n-channel device. Doped regions 408 generally represent the regions in which these dopants are introduced within semiconducting region 404 while the arrows represent the direction at which the dopants are being driven into semiconducting region 404. As technology advances, the length of gate 402 becomes smaller. At very small gate electrode spacing (i.e., less than about 100 nm), the tilt angle θ of the dopants during the LDD doping process becomes smaller. For example, tilt angle θ may be around 19 degrees as measured with respect to a sidewall edge of gate 402. This small angle drives the dopants down closer to the lower depth of S/D regions 406. As a result of the deep doped regions 408, the E-field relaxation just under gate 402 is poor and there is significant transistor performance degradation due to SCE. These effects include a larger leakage current and a reduction in the lifetime of the transistor.

Figure 5:
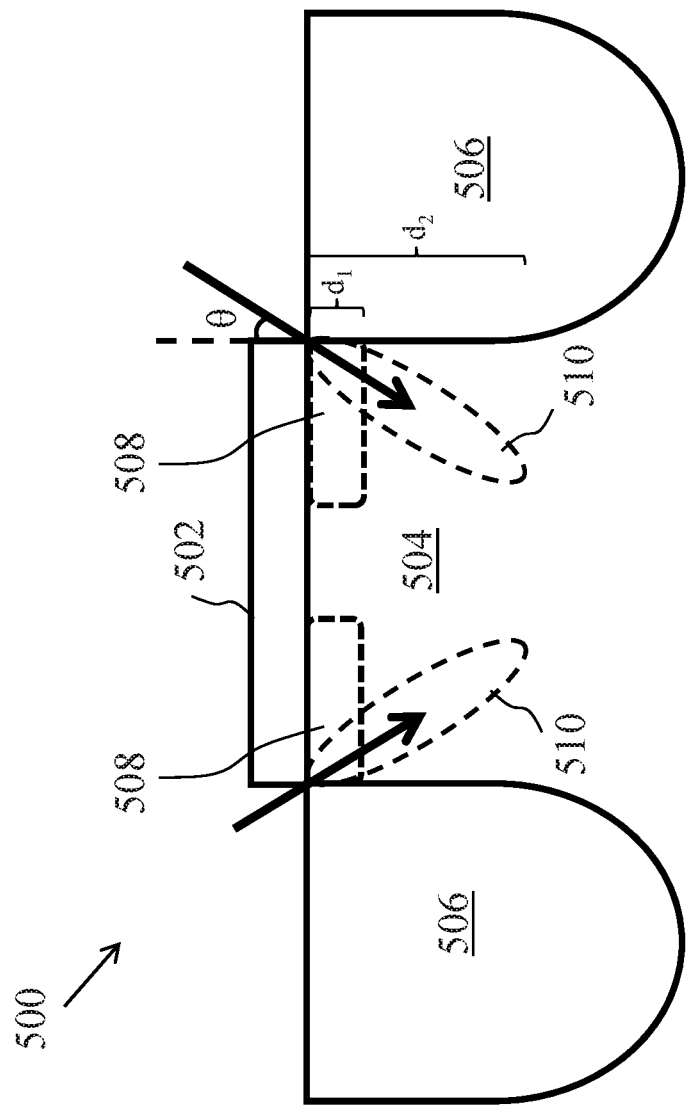
FIG. 5 is a cross-section illustration of a doping profile, according to an embodiment.

FIG. 5 illustrates a hybrid doping distribution for a semiconductor device 500 that alleviates some of the issues faced with the traditional doping method described above, according to an embodiment. Semiconductor device 500 includes a gate 502 overlaying a semiconducting region 504, and S/D regions 506 on either side of semiconducting region 504. Semiconductor device 500 may represent a high voltage I/O finFET, or any other type of finFET device. It should be understood that many elements are omitted from FIG. 5 for clarity, including sidewall spacers on gate 502, and a gate dielectric disposed between gate 502 and semiconducting region 504.

In some embodiments, the hybrid doping distribution is obtained using two different doping processes. In a first doping process, first doped regions 508 are formed beneath gate 502 in semiconducting region 504, according to an embodiment. The dopants may include boron, boron difluoride, or indium when semiconducting region 504 is n-doped (e.g., a p-channel transistor), and the dopants may include phosphorous or arsenic when semiconducting region 504 is p-doped (i.e., an n-channel transistor.) First doped region 508 may be formed at a depth $d_1$ between about 15 nm and about 18 nm. The first doping process may use a dopant dosage in a range between about $2 \times 10^{15}$ ions/cm² and about $3 \times 10^{15}$ ions/cm². First doped region 508 may include a dopant concentration in a range between $1 \times 10^{21}$ ions/cm³ and $5 \times 10^{21}$ ions/cm³. The first doping process may use a doping energy between about 7 keV and about 13 keV. In one embodiment, the first doping process uses an energy of 10 keV.

In a second doping process, second doped regions 510 are formed beneath gate 502 in semiconducting region 504, according to an embodiment. The dopants may include boron, boron difluoride, or indium when semiconducting region 504 is n-doped (i.e., a p-channel transistor), and the dopants may include phosphorous or arsenic when semiconducting region 504 is p-doped (i.e., an n-channel transistor.) Second doped regions 510 may be formed at a depth $d_2$ between about 30 nm and about 35 nm. The second doping process may use a dopant dosage in a range between about $1 \times 10^{14}$ ions/cm² and about $5 \times 10^{14}$ ions/cm². Second doped region 510 may include a dopant concentration in a range between $1 \times 10^{20}$ ions/cm³ and $5 \times 10^{20}$ ions/cm³. The second doping process may use a doping energy between about 20 keV and about 25 keV. In one embodiment, the second doping process uses an energy of 20 keV.

Second doped regions 510 may extend into semiconducting region 504 at an angle θ with respect to a sidewall edge of gate 502 as illustrated by the arrows. Angle θ may be between about 15 degrees and 25 degrees. In one embodiment, angle θ is 19 degrees.

The hybrid doping distribution may be formed via the described first and second doping processes. The first process may be performed before the second process, or the second process may be performed before the first process. The first doping process provides doping regions 508 that include a higher doping concentration compared to doping regions 510, but are doped using a lower energy, and thus are implanted or diffused into semiconducting region 504 at a smaller depth $d_1$. The second doping process provides doping regions 510 that include a lower doping concentration compared to doping regions 508, but are doped using a greater energy, and thus are implanted or diffused into semiconducting region 504 to a greater depth $d_2$.

Since the hybrid doping distribution provides a high doping concentration beneath gate 502, E-field relaxation occurs at the top of semiconducting region 504 beneath gate 502, thus reducing leakage. Additionally, the lower doping concentration closer to the bottom of S/D regions 506 helps to reduce short channel effects and increases the life-time of the device.

Figure 6:
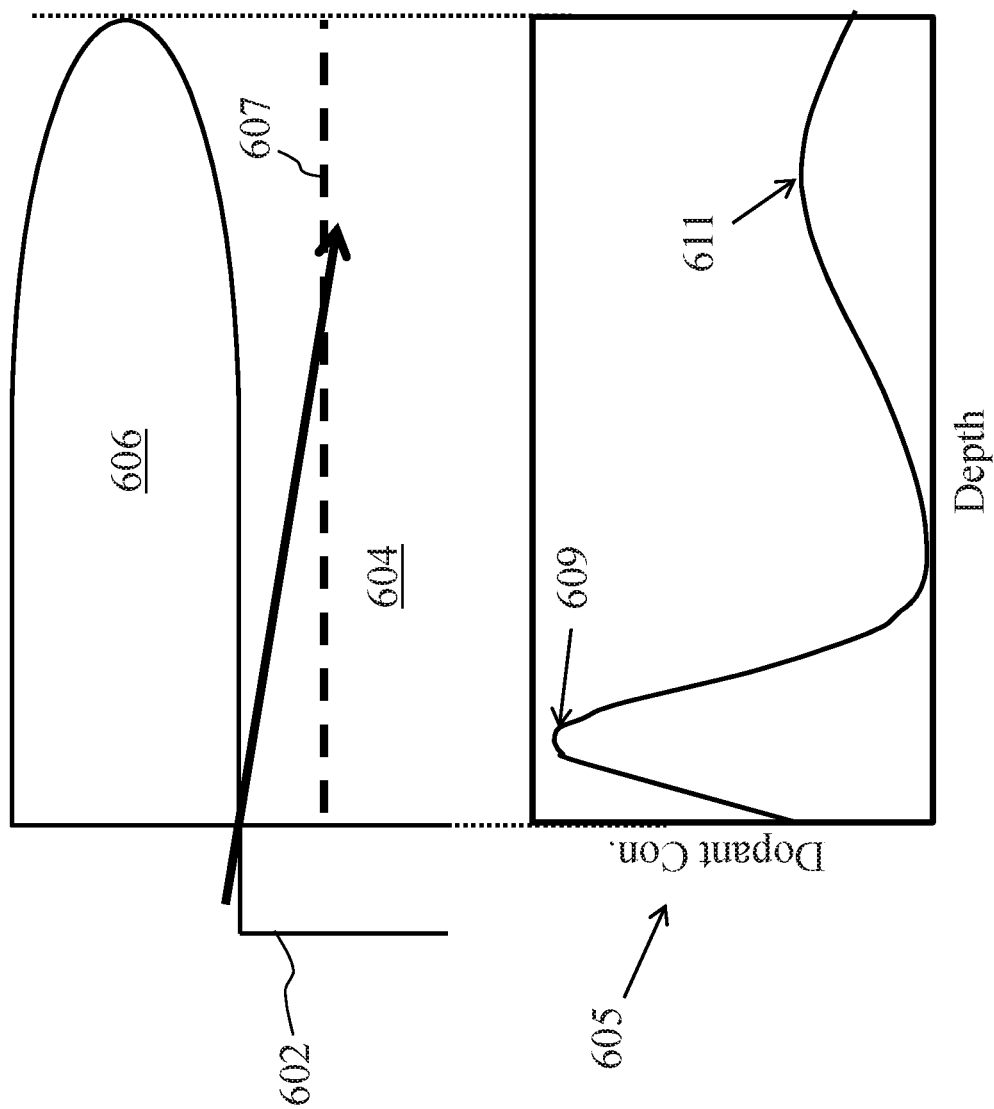
FIG. 6 is an illustration showing the relative change in doping concentration based on the depth through an active region, according to an embodiment.

FIG. 6 illustrates a graphical representation of the hybrid doping concentration vs. depth under a finFET gate 602, according to an embodiment. Similar to semiconductor device 500, a semiconducting region 604 exists beneath gate 602. As discussed above, it would be understood that gate 602 would have a gate dielectric between it and semiconducting region 604, which is not illustrated. An S/D region 606 is also illustrated adjacent to semiconducting region 604. It should be understood that another S/D region would exist on the opposite side of gate 602 and adjacent to semiconducting region 604. The arrow represents the general direction of the dopants as they are driven or diffused into semiconducting region 604 during a hybrid LDD doping process. As described above, the hybrid LDD doping process includes two doping processes to form different dopant regions having different dopant concentrations, according to an embodiment.

An example plot 605 illustrates dopant concentration vs. depth as taken across an arbitrary plane 607 beneath gate 602, according to an embodiment. Plot 605 illustrates a hybrid doping profile, according to an embodiment. Plot 605 illustrates a high dopant concentration at first peak 609 having a shallow depth beneath gate 602. The dopant concentration quickly tapers off as the depth increases beneath gate 602, and then increases again at a second peak 611 lower than first peak 609. Second peak 611 represents a lighter doped area that exists deeper (i.e., closer to the bottom of S/D region 606).

Figure 7:
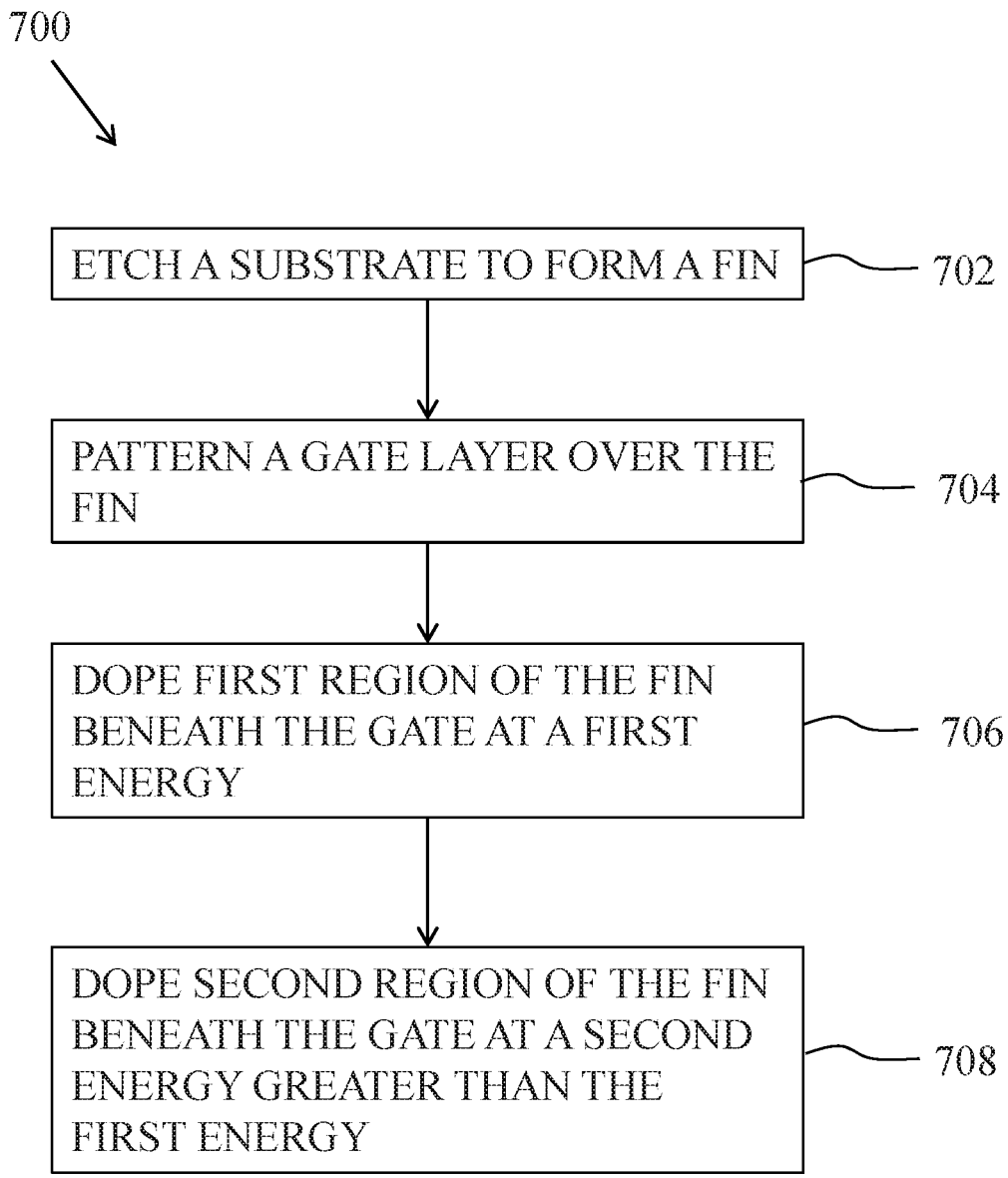
FIG. 7 is a flowchart of an example method, according to an embodiment.

FIG. 7 provides a flow diagram of an illustrative method 700, in accordance with an embodiment, of creating a hybrid doping distribution, such as that illustrated in semiconductor device 500. It is understood that additional operations may be provided before, during, and after method 700, and some of the operations described below can be replaced or eliminated for additional embodiments of the method.

Method 700 includes operations that involve fabrication of a finFET structure, while other operations of method 700 involve the hybrid doping of the fin. It should be understood that the operations may be performed at different times and/or locations. For example, the operations related to fabrication of the finFET structure may be performed during a first time period at a first location while the operations related to the hybrid doping may be performed at a second time period at a different location. In some embodiments, a partially fabricated finFET (e.g., before the LDD doping has been performed) is provided and the operations related to the hybrid doping are performed on the partially fabricated finFET.

Method 700 begins at operation 702 where a substrate is etched to form a fin. The fin may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The fin may be fabricated using suitable processes including photolithography and etch processes.

Method 700 continues with operation 704 where a blanket gate layer disposed over the fin is patterned to form a gate. At this early stage of the fabrication, the gate may be a sacrificial gate (e.g., polysilicon) that is later removed and replaced with a metal gate. The gate includes a gate dielectric between itself and the fin. The gate masks the area of the fin beneath itself during an LDD process.

Method 700 continues with operation 706, which is an operation related to the hybrid doping process, according to an embodiment. At operation 706, a first doped region of the fin beneath the gate is doped at a first doping energy. The dopants may include boron, boron difluoride, or indium when the fin is n-doped (i.e., a p-channel device), and the dopants may include phosphorous or arsenic when the fin is p-doped (i.e., an n-channel device.) The first doped region may be formed at a depth between about 15 nm and about 18 nm. The doping performed at operation 706 may use a dopant dosage in a range between about $2\times10^{15}$ ions/cm$^2$ and about $3\times10^{15}$ ions/cm$^2$. The doping performed at operation 706 may use a doping energy between about 7 keV and about 13 keV. In one embodiment, the doping energy is 10 keV.

Method 700 continues with operation 708, which is an operation related to the hybrid doping process, according to an embodiment. At operation 708, a second doped region of the fin beneath the gate is doped at a second doping energy greater than the first doping energy. The dopants may include boron, boron difluoride, or indium when the fin is n-doped (i.e., a p-channel device), and the dopants may include phosphorous or arsenic when the fin is p-doped (i.e., an n-channel device.) The second doped region may be formed at a depth between about 30 nm and about 35 nm. The doping performed at operation 708 may use a dopant dosage in a range between about $1\times10^{14}$ ions/cm$^2$ and about $5\times10^{14}$ ions/cm$^2$. The doping performed at operation 708 may use a doping energy between about 20 keV and about 25 keV. In one embodiment, the doping energy is 20 keV. Operations 706 and 708 may be performed in either order.

There are many benefits to using the hybrid doping distribution described herein as opposed to a traditional doping distribution. The hybrid doping distribution results in a relaxed E-field along the top of the fin just beneath the gate, which in turn helps to reduce leakage current and the degrading effects of hot carrier injection (HCI). Additionally, the hybrid doping distribution provides a lighter doped region deeper beneath the gate, which helps to reduce detrimental short channel effects.

In one embodiment, a semiconductor device includes a gate disposed over an active semiconducting region, and a source region and a drain region each aligned to opposing sides of the gate side walls. The active semiconducting region has a doping distribution that includes a first doping region at a first depth beneath the gate and having a first dopant concentration. The doping distribution includes a second doping region at a second depth beneath the gate greater than the first depth and having a second dopant concentration less than the first dopant concentration.

In another embodiment, a method of doping a semiconductor device includes doping an active region beneath a gate of the semiconductor device at a first energy to create a first region having a first dopant concentration at a first depth beneath the gate. The method also includes doping the active region beneath the gate of the semiconductor device at a second energy greater than the first energy to create a second region having a second dopant concentration lower than the first dopant concentration at a second depth beneath the gate greater than the first depth.

In yet another embodiment, a method of fabricating a semiconductor device includes etching a substrate to form a fin and patterning a gate over the fin. The method further includes doping a portion of the fin beneath the gate at a first energy to create a first region having a first dopant concentration at a first depth beneath the gate. The method further includes doping a portion of the fin beneath the gate at a second energy greater than the first energy to create a second region having a second dopant concentration lower than the first dopant concentration at a second depth beneath the gate greater than the first depth.

It is to be appreciated that the Detailed Description section, and not the Abstract of the Disclosure section, is intended to be used to interpret the claims. The Abstract of the Disclosure section may set forth one or more but not all exemplary embodiments of the present invention as contemplated by the inventor(s), and thus, is not intended to limit the present disclosure and the appended claims in any way.

The breadth and scope of the present invention should not be limited by any of the above-described exemplary embodiments, but should be defined only in accordance with the following claims and their equivalents.

What is claimed is:

1. A semiconductor device, comprising:
   first and second source/drain regions disposed on a substrate; and
   a gate disposed on a semiconducting region and interposed between the first and second source/drain regions,
   wherein the semiconducting region comprises first and second doped regions and a doping profile across a plane through the first and second doped regions and perpendicular to a surface of the gate,
   wherein the first doped region has a first dopant concentration between $1\times10^{21}$ atoms/cm$^3$ and $5\times10^{21}$ atoms/cm$^3$ and the second doped region has a second dopant concentration between $1\times10^{20}$ atoms/cm$^3$ and $5\times10^{20}$ atoms/cm$^3$,
   wherein the doping profile comprises first and second peak dopant concentrations, and
   wherein the first peak dopant concentration is greater in magnitude and closer to the surface of the gate than the second peak dopant concentration.

2. The semiconductor device of claim 1, wherein the first and second doped regions have first and second depths from the surface of the gate, respectively, and wherein the second depth is greater than the first depth.

3. The semiconductor device of claim 2, wherein the first depth is between 15 nm and 18 nm and the second depth is between 30 nm and 35 nm.

4. The semiconductor device of claim 1, wherein the first and second doped regions extend at first and second angles into the semiconducting region, respectively, and wherein the first angle is greater than the second angle.

5. The semiconductor device of claim 1, wherein the second doped region extends into the semiconducting region at an angle between 15 degrees and 25 degrees with respect to a sidewall of the gate.

6. The semiconductor device of claim 1, wherein the first and second doped regions have dopants of same type.

7. A finFET device, comprising:
   a fin structure disposed on a substrate;
   a gate disposed on a first fin portion of the fin structure; and
   first and second epitaxial regions disposed on second and third fin portions of the fin structure, respectively,
   wherein the first fin portion comprises first and second doped regions and a doping profile across a plane extending from a surface of the first fin portion,
   wherein the first doped region has a first dopant concentration between $1\times10^{21}$ atoms/cm$^3$ and $5\times10^{21}$ atoms/cm$^3$ and the second doped region has a second dopant concentration between $1\times10^{20}$ atoms/cm$^3$ and $5\times10^{20}$ atoms/cm$^3$,
   wherein the doping profile comprises first and second peak dopant concentrations, and
   wherein the first peak dopant concentration is greater in magnitude and closer to the surface of the first fin portion than the second peak dopant concentration.

8. The finFET device of claim 7, wherein the first and second doped regions have first and second depths, respectively, from the surface of the first fin portion, and wherein the second depth is greater than the first depth.

9. The finFET device of claim 8, wherein the first depth is between 15 nm and 18 nm and the second depth is between 30 nm and 35 nm.

10. The finFET device of claim 7, wherein the second doped region extends into the first fin portion at an angle between 15 degrees and 25 degrees with respect to a sidewall of the gate.

11. The finFET device of claim 7, wherein the first and second doped regions have dopants of same type.

12. The finFET device of claim 7, wherein the first and second epitaxial regions have a dopant concentration greater than a first dopant concentration of the first doped region or a second dopant concentration of the second doped region.

13. The finFET device of claim 7, wherein the first and second doped regions have dopants different from each other.

14. A method of fabricating a finFET device, the method comprising:
   forming a fin structure on a substrate;
   forming a gate over a first fin portion of the fin structure;
   forming source/drain regions on second and third fin portions of the fin structure; and
   doping first and second regions in the first fin portion with a first dopant concentration between $1\times10^{21}$ atoms/cm$^3$ and $5\times10^{21}$ atoms/cm$^3$ and a second dopant concentration between $1\times10^{20}$ atoms/cm$^3$ and $5\times10^{20}$ atoms/cm$^3$, respectively, to form a doping profile across a plane in the first fin portion,
   wherein the doping profile has first and second peak dopant concentrations corresponding to the first and second regions, respectively, and
   wherein the first peak dopant concentration is greater in magnitude than the second peak dopant concentration.

15. The method of claim 14, wherein the plane is perpendicular to a horizontal surface of the first fin portion, and wherein the first peak dopant concentration is closer to the horizontal surface than the second peak dopant concentration.

16. The method of claim 14, wherein the forming the source/drain regions comprises epitaxially growing doped regions on the second and third fin portions with a dopant concentration greater than the first dopant concentration of the first doped region or the second dopant concentration of the second doped region.

17. The method of claim 14, wherein the doping the first and second regions comprises doping the first region with a first energy and doping the second region with a second energy greater than the first energy.

18. The method of claim 14, wherein the doping the second region comprises implanting dopants at an angle less than 90 degrees with respect to a sidewall of the gate.

19. The method of claim 14, wherein the doping the first region comprises doping with an energy between 7 keV and 13 keV.

20. The method of claim 14, wherein the doping the second region comprises doping with an energy between 20 keV and 25 keV.

\* \* \* \* \*